United States Patent
Mieske

(10) Patent No.: US 10,530,146 B2
(45) Date of Patent: Jan. 7, 2020

(54) DIFFERENTIAL PROTECTION METHOD AND DIFFERENTIAL PROTECTION DEVICE FOR PERFORMING A DIFFERENTIAL PROTECTION METHOD

(71) Applicant: SIEMENS AKTIENGESELSCHAFT, Munich (DE)

(72) Inventor: Frank Mieske, Berlin (DE)

(73) Assignee: Siemens Aktiengesellschaft, Munich (DE)

( * ) Notice: Subject to any disclaimer, the term of this patent is extended or adjusted under 35 U.S.C. 154(b) by 291 days.

(21) Appl. No.: 15/526,802

(22) PCT Filed: Nov. 14, 2014

(86) PCT No.: PCT/EP2014/074610
§ 371 (c)(1),
(2) Date: May 15, 2017

(87) PCT Pub. No.: WO2016/074742
PCT Pub. Date: May 19, 2016

(65) Prior Publication Data
US 2017/0331279 A1    Nov. 16, 2017

(51) Int. Cl.
*H02H 7/045* (2006.01)
*H02H 7/06* (2006.01)
(Continued)

(52) U.S. Cl.
CPC .......... *H02H 7/0455* (2013.01); *H02H 7/065* (2013.01); *G01R 19/165* (2013.01);
(Continued)

(58) Field of Classification Search
CPC ...... H02H 7/0455; H02H 7/045; H02H 7/065; H02H 3/00; G01R 19/165
(Continued)

(56) References Cited

U.S. PATENT DOCUMENTS

| 5,790,357 A | 8/1998 | Schiel |
| 2002/0101229 A1* | 8/2002 | Roberts .................... H02H 3/30 324/107 |

(Continued)

FOREIGN PATENT DOCUMENTS

| DE | 4416048 C1 | 12/1995 |
| DE | 10261848 A1 | 7/2004 |

(Continued)

*Primary Examiner* — Zeev V Kitov
(74) *Attorney, Agent, or Firm* — Laurence Greenberg; Werner Stemer; Ralph Locher

(57) ABSTRACT

A differential protection method for generating a fault signal includes measuring current measurements at least at two different measuring points of a multiphase transformer for each phase. The current measurements for each phase are used to form differential current values and stabilization values. The fault signal is generated if it is determined during a trigger region check that a measurement pair of at least one of the phases, being formed by using one of the differential current values and the associated stabilization value in each case, is in a predefined trigger region. In order to be able to selectively and reliably distinguish an external fault from an internal fault, the transformer has a grounded star point and a zero system current flowing through the star point is used to form the stabilization values. A corresponding differential protection device is provided for performing the differential protection method.

8 Claims, 3 Drawing Sheets

(51) Int. Cl.
*H02H 3/30* (2006.01)
*G01R 31/02* (2006.01)
*H02J 3/00* (2006.01)
*G01R 19/165* (2006.01)

(52) U.S. Cl.
CPC ............ *G01R 31/025* (2013.01); *H02H 3/30* (2013.01); *H02J 3/00* (2013.01)

(58) Field of Classification Search
USPC .......................................................... 361/36
See application file for complete search history.

(56) References Cited

U.S. PATENT DOCUMENTS

| | | | |
|---|---|---|---|
| 2014/0002937 A1* | 1/2014 | Tausa .................... | H02H 3/343 361/76 |
| 2015/0293166 A1 | 10/2015 | Mieske | |
| 2015/0349511 A1* | 12/2015 | Kojovic ............... | G01R 15/181 361/36 |

FOREIGN PATENT DOCUMENTS

| WO | 2008025309 A1 | 3/2008 |
|---|---|---|
| WO | 2014079511 A1 | 5/2014 |

* cited by examiner

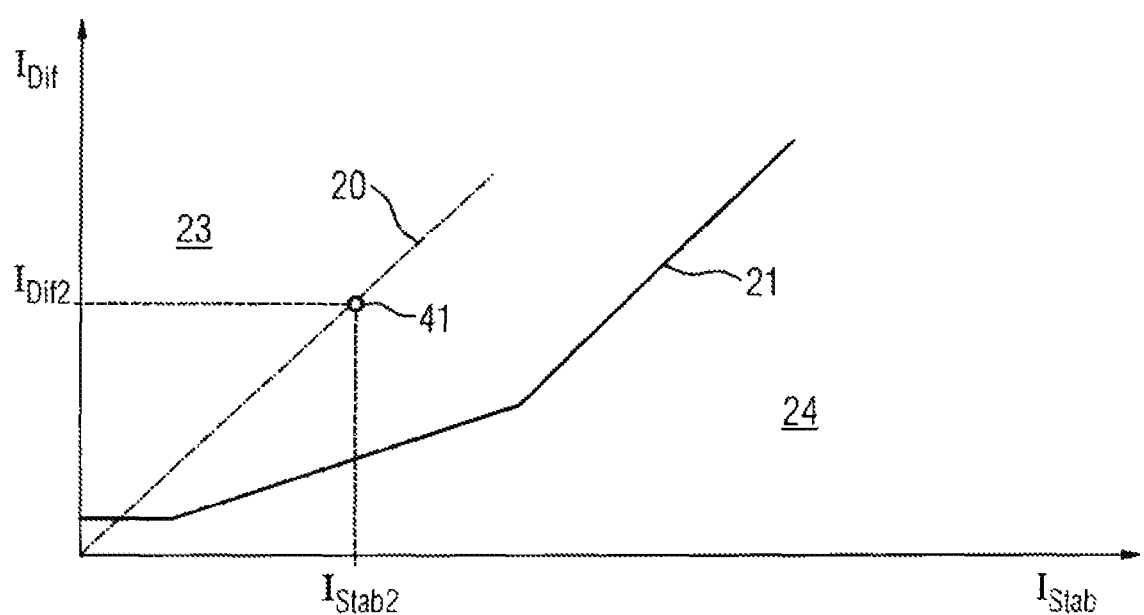

DIFFERENTIAL PROTECTION METHOD AND DIFFERENTIAL PROTECTION DEVICE FOR PERFORMING A DIFFERENTIAL PROTECTION METHOD

BACKGROUND OF THE INVENTION

Field of the Invention

The invention relates to a differential protection method for generating a fault signal, in which current measurements are respectively measured at least two different measuring points of a multiphase transformer for each phase, differential current values and stabilization values are formed with the current measurements for each phase, and the fault signal is generated if it is determined during a trigger region check that a pair of measurements, created with the aid of one of the differential current values and the respectively associated stabilization value, of at least one of the phases lies in a predefined trigger region. The invention also relates to a corresponding electrical differential protection device for performing a differential protection method Differential protection devices for performing a differential protection method are employed, amongst other things, for monitoring multiphase, e.g. three-phase, transformers in energy supply networks. Here, at at least two different measuring points of the monitored transformer, usually on both sides of the transformer in the case of a two-sided transformer, the current flowing at the measuring points is acquired for each phase and supplied to the protection device in the form of current measurements. Through addition, taking the arithmetic sign into account, the protection device forms differential current values that are used to assess the operating situation of the monitored transformer for each phase from the current measurements.

Since a transformer itself causes a change in the amplitude and the phase angle in the current flowing through it, the current measurements of at least one side must be adjusted in respect of their amplitude and their phase angle before forming the differential current value, in order to obtain current measurements for both sides of the transformer that can be compared with one another. For the amplitude, this adjustment is usually done using the known transformer ratio of the transformer. For the phase angle, an adjustment also takes place making use of appropriate adjustment matrices. The respective adjustment matrix is for example derived from the vector group of the transformer, and can, for example, be taken from suitable tables. It is, in addition, also possible to perform an automatic phase angle adjustment, for example by measuring the phase angle difference between the current measurements at the different measuring points of the transformer. Both the amplitude adjustment and the phase angle adjustment are sufficiently well known to the expert, and will therefore not be explained in detail at this point.

Since in the case of a transformer with a grounded star point on one side of the transformer, a zero current can arise and can affect the differential current measurement, an additional correction of a zero current component of the current measurements of the transformer is usually performed. Either a measured star point current, or a zero current calculated from the current measurements of the individual phases, can be used for this purpose.

The formation of the differential current value is performed after appropriate adjustment of the amplitudes and the phase angle of the current measurements and after a zero current correction.

In the fault-free case, the differential current values lie in a range close to zero, since in this case—simply expressed—the current flowing into the transformer also flows out of it again. If, on the other hand, differential current values that differ significantly from zero arise, these lead to the conclusion of a faulty operating state, for example an internal short circuit, so that the fault current must be interrupted by opening transformer-isolating switching equipment such as power switches. For this purpose the protection device generates a corresponding fault signal which is used to generate a trigger signal in order to cause the switches to open their switching contacts.

Since ideal conditions, such as a differential current that has a value of exactly zero in the fault-free case, do not normally obtain in practice, a suitable comparison value must be found for the differential current. The so-called stabilization value, which is for example calculated by forming the sum of the sizes of the respective current values, is used for this purpose. Forming the difference of the sizes of the respective current measurements, or the selection of the maximum value from the sizes of the respective current measurements, are other possibilities for calculating stabilization values in transformer differential protection.

If a differential current value and an associated stabilization value are entered into a trigger diagram, the respective pair of measurements either lies inside or outside a specified trigger region, so that by evaluating the position of the pair of measurements it is possible to come to a conclusion regarding formation of the fault signal: the fault signal is generated if the pair of measurements lies inside the predefined trigger region.

Problems result from this when, for example, one or more of the current transducers used, especially in the case of high-current external faults, i.e. faults located outside the monitored transformer, go into saturation, and the secondary current curve delivered by them does not represent a correct image of the primary-side current curve. In such cases, a significant differential current can be detected incorrectly, and a fault signal generated as a result.

A differential protection method of the type mentioned above is known, for example, from WO 2008/025309 A1. In the known differential protection device, the current curves acquired at the different measuring points of a component of an energy supply network, e.g. of a transformer, are examined from the point of view of similarity, and the sensitivity of the triggering of the differential protection is adjusted according to the similarity detected. In this way what can be achieved is that in the event of non-similar current curves—e.g. resulting from transducer saturation—the sensitivity of the differential protection device is appropriately lowered, in order not to output an unwanted fault signal.

A differential protection method is also known from WO 2014/079511 A1, in which predicted future values of differential current values and stabilization current values are determined through estimation on the basis of a few acquired current measurements, and the position of the respective pairs of measurements in a trigger region is checked for the decision about generating a fault signal.

SUMMARY OF THE INVENTION

The invention is based on the object of providing a method or a differential protection device for monitoring a multiphase transformer in order to be able to distinguish an external fault from an internal fault selectively and reliably.

In terms of the method, this object is achieved by a differential protection method of the type mentioned above, in which the transformer has a grounded star point, and a zero system current flowing through the star point is used for the formation of the stabilization values.

When performing a differential protection method for transformers with grounded star point, it has namely been found that, through a zero current correction performed in this case, the current measurements, and thereby also the stabilization values for that side of the transformer on which the zero current correction is performed, becomes zero. As a result, the stabilization current in this case only takes into account the load current flowing on the sides of the transformer that do not have a grounded star point, which can also have a size of zero when the transformer is unloaded, so that in this case—as a result of the absence of stabilization of the differential protection method—the risk of an incorrect trigger arises—in particular in the case of heavy-current external faults and/or the presence of transducer saturation. By including the zero system current in the calculation of the stabilization values, the risk of triggering a fault for such cases can, however, be significantly reduced, since in this case, due to the comparatively large zero system current in the presence of a fault, adequately large stabilization values can always be formed.

According to an advantageous form of embodiment of the method according to the invention, it is provided that a maximum value from the current measurements formed at the respective measuring points and the zero system currents flowing on the respective sides of the transformer is used as the respective stabilization value.

In this form of embodiment, the value of the zero system current is namely included in an advantageous manner directly in the level of the stabilization value.

According to a further advantageous form of embodiment of the method according to the invention, it is provided that the zero system current is determined by measuring a current flowing through the star point.

This form of embodiment is suitable when the star point current can be acquired by a dedicated current transducer. One possible way of measuring the star point current is known, for example, from DE4416048C1.

As an alternative to this form of embodiment it is also possible to provide, according to another advantageous form of embodiment of the method according to the invention, for the zero system current to be determined computationally from the current measurements acquired for the individual phases.

This calculation can take place on the basis of the current measurements $I_A$, $I_B$, $I_C$ on that side of the transformer that comprises the grounded star point as follows, and is known to the expert as "zero current elimination":

$$3I_0 = I_A + I_B + I_C.$$

A separate current transducer for measuring a current flowing through the star point is not necessary in this case.

The abovementioned object is also achieved through an electrical differential protection device for forming a fault signal, with terminals for direct or indirect connection to at least two different measuring points of a component of an electrical energy supply network, and with an evaluation device which is designed to form differential current values and stabilization values using current measurements acquired at the measurement points, and to generate a fault signal if a pair of measurements, formed using one of the differential current values and the respectively associated stabilization value, lies in a predefined trigger region.

It is provided according to the invention that the transformer has a grounded star point, and the evaluation device is designed to use a zero system current flowing through the star point to form the stabilization values.

An advantageous development of the differential protection device according to the invention provides that the evaluation device is designed to determine the respective stabilization value through determining the maximum value from the current measurements formed at the respective measuring points, and the zero system currents flowing on the respective sides of the transformer.

In terms of the acquisition of the zero system current, it can also be provided that the protection device comprises a terminal for the direct or indirect connection to a star point current measurement point, and the evaluation device is designed to determine the zero system current through measurement of a current flowing through the star point, or that the evaluation device is designed to determine the zero system current computationally from the current measurements acquired for the individual phases.

In terms of the differential protection device according to the invention, all of the explanations concerning the differential protection method according to the invention made above and below also apply, and vice versa in a similar manner; in particular, the differential protection device according to the invention is designed to perform the differential protection method according to the invention in any arbitrary form of embodiment or a combination of arbitrary forms of embodiment. In terms of the advantages of the differential protection device according to the invention, reference is also made to the advantages described for the differential protection method according to the invention.

The invention is explained below in more detail with reference to an exemplary embodiment. The specific design of the exemplary embodiment is not to be understood as restrictive in any way for the general design of the differential protection method according to the invention and the protection device according to the invention; on the contrary, individual design features of the exemplary embodiment can be combined in an arbitrary manner freely with one another and with the features described above.

BRIEF DESCRIPTION OF THE SEVERAL VIEWS OF THE DRAWING

FIGS. 2-4 show trigger diagrams with pairs of measurements of differential current values and stabilization values entered by way of example.

DESCRIPTION OF THE INVENTION

For reasons of simplified illustration, a transformer with two sides is assumed in the context of the exemplary embodiment. To apply the invention to transformers with more than two sides, the method described has to be carried out for all the other sides in a corresponding manner.

Figure 1:
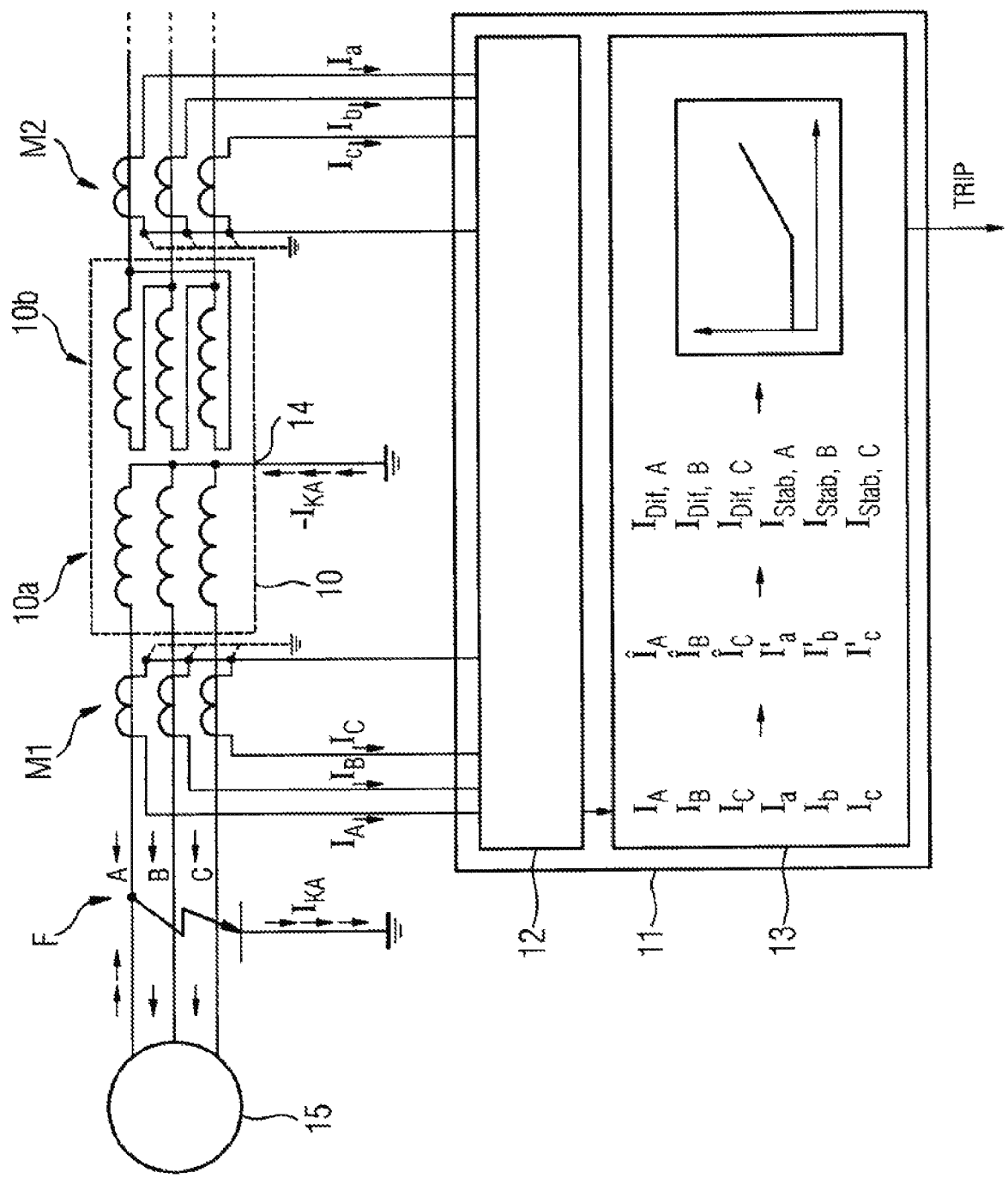
FIG. 1 shows a schematic view of a differential protection device monitoring a transformer.

FIG. 1 shows a schematic view of a section of a three-phase (phase conductors A, B, C) electrical energy supply system with a two-sided transformer 10 in star-delta connection with a grounded star point 14 on the high-voltage side 10a. The transformer 10 is monitored by means of a differential protection device 11 in respect of the occurrence of internal faults (e.g. short-circuits, ground shorts, winding faults). Current measurements $I_A$, $I_B$, $I_C$ are acquired for this purpose at a first measuring point M1 on the high-voltage side 10a of the transformer 10 by means of current measuring devices (e.g. inductive transducers or so-called nonconventional transducers), and are supplied to corresponding terminals of a measurement acquisition device 12 of the differential protection device 11. In a corresponding manner, current measurements $I_a$, $I_b$, $I_c$ are acquired at a second measuring point M2 on a low-voltage side 10b of the transformer 10 by means of current measuring devices, and are correspondingly supplied to further terminals of the measurement acquisition device 12 of the differential protection device 11. The current measurements $I_A$, $I_B$, $I_C$, $I_a$, $I_b$, $I_c$ can here be transferred in analog or digital form to the measurement acquisition device 12. If the current measurements $I_A$, $I_B$, $I_C$, $I_a$, $I_b$, $I_c$ are present as analog measurements at the measurement acquisition device 12, they are filtered and subjected to an A/D conversion there. Otherwise filtering and A/D conversion already takes place outside the measurement acquisition device 12, for example by means of a so-called remote terminal unit or a merging unit. The digitized measurements are transferred in this case to the differential protection device 11 over a process bus.

The measurement acquisition device 12 is connected on its output side to an evaluation device 13 of the differential protection device 11, which can, for example, consist of an appropriately configured hardware computing component (ASIC, FPGA), a central microprocessor assembly, a digital signal processor (DSP) or a combination of the said devices. The evaluation device 13 is configured through software-determined and/or hardware-determined programming, to use the current measurements from both sides of the transformer 10 to carry out a differential protection method in order to be able to detect any internal faults and to switch off.

Because changes of amplitude and phase angle of the current output on the low-voltage side in comparison with the sizes present on the high-voltage side occur in the transformation of current and voltage by the transformer 10, it is first necessary in order to carry out the differential protection method, for the amplitude and the phase angle of the current measurements to be adjusted. An adjustment of this sort in respect of the currents $I_a$, $I_b$, $I_c$ on the low-voltage side 10b of the transformer 10 is described below, although it would, alternatively or in addition, equally be possible to adjust the current measurements of the high-voltage side 10a.

For the amplitude-related adjustment, the current measurements $I_a$, $I_b$, $I_c$ are adjusted using the transformer ratio n. This gives the ratio of the number of windings of the high-voltage winding to those of the low-voltage winding, and determines the amplitude-related change of the current during the transformation process. An adjustment of the phase angle between the high-voltage side and the low-voltage side is also carried out. The change in the phase angle results primarily from the constructively predetermined vector group and from the position of any tap switch. These adjustments are sufficiently well known, and are therefore not explained in further detail at this point. After the adjustment of the amplitude and of the phase angle, adjusted current measurements $I'_a$, $I'_b$, $I'_c$ are present at the output side.

On the high-voltage side 10a of the transformer 10, a zero system current component $I_0$ can occur as a result of the grounding of the star point 14. This is compensated for through appropriate correction prior to performing the differential protection method. The following equation represents the zero system current correction for the current measurements $I_A$, $I_B$, $I_C$ acquired at the high-voltage side 10a:

$$\begin{pmatrix} \hat{I}_A \\ \hat{I}_B \\ \hat{I}_C \end{pmatrix} = \begin{pmatrix} 1 & 0 & 0 \\ 0 & 1 & 0 \\ 0 & 0 & 1 \end{pmatrix} \cdot \begin{pmatrix} I_A \\ I_B \\ I_C \end{pmatrix} + \begin{pmatrix} I_0 \\ I_0 \\ I_0 \end{pmatrix}. \tag{1}$$

$\hat{I}_A$, $\hat{I}_B$, $\hat{I}_C$ here represent the current measurements, corrected for the zero system current, of the high-voltage side 10a; $I_0$ represents zero system current.

Zero system current $I_0$ can here be determined, for example computationally, from the current measurements $I_A$, $I_B$, $I_C$:

$$3I_0 = I_A + I_B + I_C.$$

The zero system current can alternatively also be determined through measurement of the star point current $I_{St}$ if an appropriate measuring device is present in the current path between the star point 14 and ground, and transmitted to the differential protection device 11 (not shown in FIG. 1).

The amplitude-adjusted and phase-angle-adjusted current measurements $I'_a$, $I'_b$, $I'_c$ of the low-voltage side 10b can now be employed, together with the zero current-corrected current measurements $\hat{I}_A$, $\hat{I}_B$, $\hat{I}_C$ acquired on the high-voltage side 10a, for the differential protection comparison. With the formation of a respective differential current value $I_{Dif}$, the difference between the sizes of the current measurements belonging in each case to a phase is formed here:

$$I_{Dif,A} = |\hat{I}_A - I'_a|,$$

$$I_{Dif,B} = |\hat{I}_B - I'_b|,$$

$$I_{Dif,C} = |\hat{I}_C - I'_c|.$$

In order to adjust the differential protection method dynamically to the size of the current flowing at any one time, and to compensate for any transducer errors in the current measuring devices used, a stabilization value $I_{Stab}$ is additionally formed for each phase from the current measurements corrected for the zero system current, or from the amplitude-adjusted and phase-angle adjusted current measurements, $\hat{I}_A$, $\hat{I}_B$, $\hat{I}_C$ and $I'_a$, $I'_b$, $I'_c$ respectively. The incorrectly determined differential current value $I_{Dif}$ resulting from transducer errors namely increases in proportion to the current flowing through the transformer, and in the event of external short-circuit currents can rise so strongly with transducer saturation that without stabilization it would lead to triggering, although the fault is not located within the protection region, that is within the transformer 10.

On the basis of the calculated differential current value $I_{Dif}$ and of the associated stabilization value $I_{Stab}$, the position of a pair of measurements comprising differential current value $I_{Dif}$ and stabilization value $I_{Stab}$ is checked for each phase in a trigger diagram. If the pair of measurements of at least one phase of the transformer 10 is located within a trigger region, then a fault signal indicating the fault is generated, and can be used by the differential protection device 11 to form a trigger signal TRIP for a power switch (not illustrated in FIG. 1), in order to prevent further damage to the transformer 10. The trigger signal TRIP causes the power switch to open appropriate switch contacts in order to disconnect the transformer 10 from the rest of the energy supply network.

In conventional approaches, the stabilization value $I_{Stab}$ of transformers is either determined as the sum of the sizes of the corresponding zero system current-corrected or adjusted current measurements $$I_{Stab,A} = |\hat{I}_A| + |I'_a|,$$

as the size of the difference of the corresponding zero system current-corrected or adjusted current measurements $$I_{Stab,A}=|\hat{I}_A|-|I'_a|,$$

or as the maximum value from the corresponding zero system current-corrected or adjusted current measurements $$I_{Stab,A}=\text{Max}(|\hat{I}_A|;|I'_a|)$$

The above equations are formulated by way of example in each case for the phase A of the transformer 10; the equations for calculating the stabilization values $I_{Stab,B}$ and $I_{Stab,C}$ for the two other phases B, C are to be set up correspondingly.

With this sort of conventional formation of the stabilization value, however, weaknesses in terms of the treatment of the zero current at a grounded star point in the presence of heavy-current external faults and transducer saturation that may occur, have emerged. Such an external fault, i.e. one located outside the transformer, between phase A and ground at the fault location F on the cable section between a generator 15 and the transformer 10 is illustrated in FIG. 1. This external fault must be recognized as such by the differential protection device 11, and should not lead to unwanted triggering.

In the case of the external, single-pole fault illustrated, with contact to ground and feed through the grounded transformer, the short-circuit current $-I_{kA}$ flows through the transformer star point 14 as the zero system current $I_0$ (the short-circuit current flowing is suggested in FIG. 1 by arrows; the size of the respective short-circuit current that is flowing is suggested by the number of arrows, where more arrows stand for a higher short-circuit current). The short-circuit current is represented on the high-voltage side 10a of the transformer 10 equally in all three phases A, B, C. The zero-system current $I_0$ on the other hand is not represented on the low-voltage side 10b of the transformer 10, since this is implemented as a delta-winding. For this reason, in the transformer differential protection, prior to the formation of the differential current value $I_{Dif}$ and of the stabilization value $I_{Stab}$, the zero-system current correction explained above is performed in respect of those sides of the transformer 10 that have a grounding (in the present example, this is only the high-voltage side 10a).

In terms of the single-pole fault in FIG. 1, the fault current on the high-voltage side 10a is equal in size in terms of amplitude and phase angle in all three phases. The following thus applies to the high-voltage side 10b when the transformer 10 is unloaded:

$$I_A=I_B=I_C=\tfrac{1}{3}I_{kA}$$

and $$3I_0=-I_{kA}$$

The zero-current-treated current measurements of the high-voltage side 10a thus yield, according to equation (1):

$$\begin{pmatrix}\hat{I}_A\\\hat{I}_B\\\hat{I}_C\end{pmatrix}=\begin{pmatrix}1&0&0\\0&1&0\\0&0&1\end{pmatrix}\cdot\begin{pmatrix}\tfrac{1}{3}I_{kA}\\\tfrac{1}{3}I_{kA}\\\tfrac{1}{3}I_{kA}\end{pmatrix}-\tfrac{1}{3}\begin{pmatrix}I_{kA}\\I_{kA}\\I_{kA}\end{pmatrix}=\begin{pmatrix}0\\0\\0\end{pmatrix}.$$

As can be seen from the above equation, if only the short-circuit current $I_{kA}$ is considered, i.e. without taking the load current into account, the zero-current-treated current measurements on the high-voltage side 10a become zero. The above-described conventional calculation methods for the stabilization values thus lead to stabilization values that only take the load current on the low-voltage side 10b of the transformer 10 into account. When the transformer is unloaded, such a load current can also be zero, so that altogether a stabilization value of zero (or close to zero) is determined.

Figure 2:
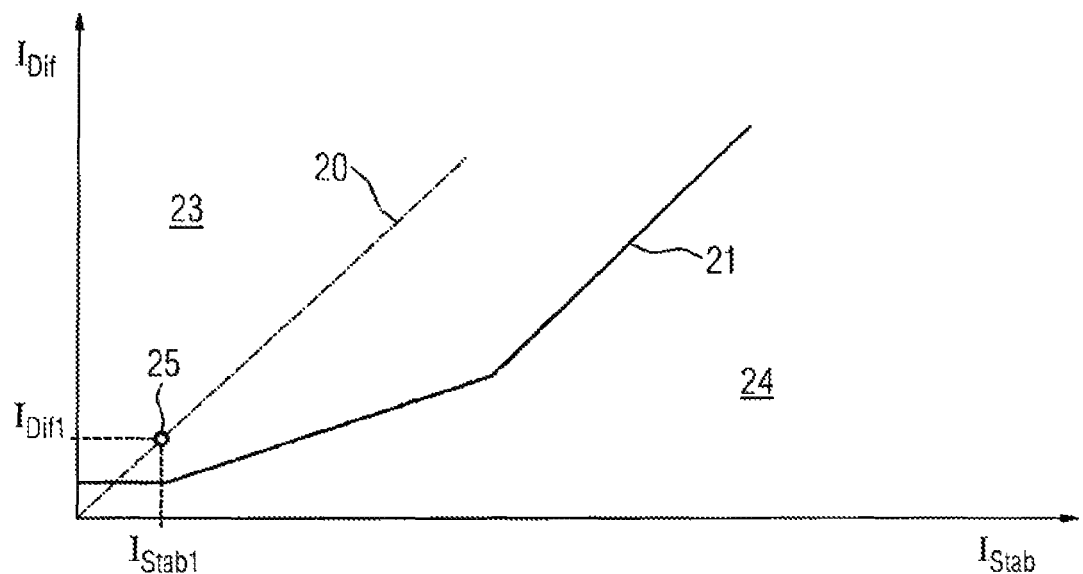
Figure 3:
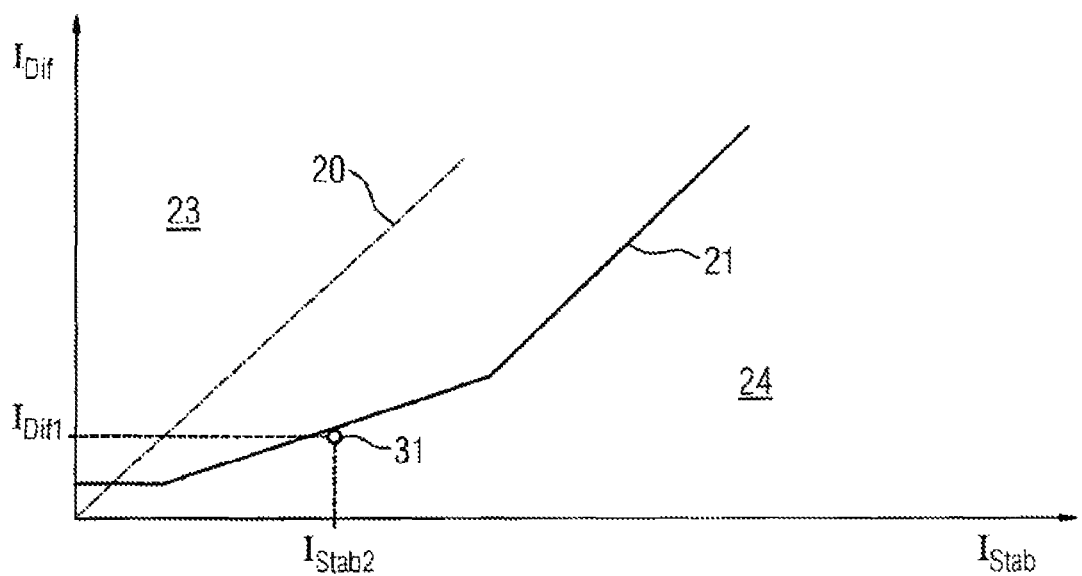

If a cable current transducer does not accurately transmit the current (e.g. when the transducer is saturated, but also as a result of inaccurate measurements), the incorrect component in the former method is represented with equal proportions in the differential current value and in the stabilization value. This ratio of approximately 1 appears in the trigger diagram as a characteristic fault line in the case of the internal fault with single-sided feed, and unwanted triggering results. This case is illustrated by way of example in the trigger diagram of FIG. 2, which, for the sake of simplicity (as is also true of the subsequent trigger diagrams in FIGS. 3 and 4) is only drawn for one phase, for example phase A. In the trigger diagram, pairs of measurements consisting of determined differential current values and associated stabilization values are checked to examine their position. The characteristic fault line 20 can be seen as a diagonal in the trigger diagram. The characteristic trigger line 21 separates the trigger region 23 from the normal region 24. The pair of measurements 25 of the differential current value $I_{Dif1}$ and the stabilization value $I_{Stab1}$ calculated in the conventional manner is located in the trigger region 24, and therefore leads—in spite of the fault being external—to triggering.

It is proposed that to solve this problem, the calculation of the stabilization value is changed, in that the stabilization value is determined by also taking a zero system current that is present into account. The stabilization value is preferably formed through a selection of the maximum value from the respective current measurements, adjusted and/or zero-current-corrected if relevant, for each phase, as well as from the measured or calculated zero system current (considered below for phase A by way of example):

$$I_{Stab,A}=\text{Max}(|\hat{I}_A|;|I_{0,s1}|;|I'_a|;|I_{0,s2}|)$$

Here $I_{0,s1}$ and $I_{0,s2}$ represent the calculated or measured zero system currents on the respective sides of the transformer (S1: side 1, the high-voltage side 10a in the present case; S2: side 2, the low-voltage side 10b in the present case). If a zero system current is not present—as is the case here for the low-voltage side 10b—this term is correspondingly omitted from the determination of the stabilization value; in the present case it follows that only the zero system current $I_{0,S1}$ on the high-voltage side is included in the calculation of the stabilization value. The stabilization value is determined separately for each phase. The number of sides of the transformer in use in which zero currents occur and which therefore require zero current correction, also determines the number of zero currents to be considered for the formation of the stabilization value.

As a result of the changed determination of the stabilization value, an incorrectly formed zero system current is now included directly in the stabilization of the differential protection method, and is appropriately considered in the check of the trigger region. The solution illustrated therefore solves the problem of an incorrect triggering in the case of the external fault illustrated in FIG. 1. This is illustrated by way of example in FIG. 3. If the value of the differential current value $I_{Dif1}$ remains the same in comparison with the trigger diagram in FIG. 2, the significantly higher zero system current is now included in the calculation of the stabilization value $I_{Stab}$. As a result, instead of the stabilization value $I_{Stab1}$ used in the case of FIG. 2, the higher value $I_{Stab2}$ is now used; the pair of measurements 31 comprising $I_{Dif1}$ and $I_{Stab2}$ is now located in the normal region 24. Accordingly, triggering is not initiated by the differential protection device 11 for the external fault.

FIG. 4 shows, by way of example, the case of an internal fault (not illustrated in FIG. 1). As a result of the differential current value $I_{Dif2}$, which is now larger, the pair of measurements 41 comprising $I_{Dif2}$ and $I_{Stab2}$ now falls in the trigger region 23. The differential protection device 11 correspondingly initiates a triggering of a power switch to switch off the internal fault.

The solution described advantageously allows the formerly known, proven basic principles of the standard differential current protection to be retained, with the same settings for the characteristic trigger curve 21, so that in this respect no changed settings have to be made. The formation of the differential current value $I_{Dif}$ is also unchanged. A change only occurs in the way in which the stabilization value $I_{Stab}$ is formed. This is also important, in order to avoid over-stabilization in the case of internal faults, with the associated under-function. At the same time, however, an improved stabilization is achieved with external faults.

The invention claimed is:

1. A differential protection method for generating a fault signal, the method comprising the following steps:
    measuring respective current measurements at least at two different measuring points of a multiphase transformer for each phase;
    forming differential current values and stabilization values with the current measurements for each phase;
    using a zero system current flowing through a grounded star point of the transformer to form the stabilization values; and
    generating the fault signal if it is determined during a trigger region check that a pair of measurements, created by using one of the differential current values and a respectively associated stabilization value, of at least one of the phases lies in a predefined trigger region.

2. The differential protection method according to claim 1, which further comprises using a maximum value from the current measurements formed at the respective measuring points and the zero system currents flowing on respective sides of the transformer.

3. The differential protection method according to claim 1, which further comprises determining the zero system current by measuring a current flowing through the star point.

4. The differential protection method according to claim 1, which further comprises determining the zero system current computationally from the current measurements acquired for the individual phases.

5. An electrical differential protection device for forming a fault signal, the device comprising:
    terminals for direct or indirect connection to at least two different measuring points of a multiphase transformer having a grounded star point through which a zero system current flows; and
    an evaluation device configured to form differential current values and stabilization values using current measurements acquired at the measuring points;
    said evaluation device configured to generate a fault signal if a pair of measurements, formed by using one of the differential current values and a respectively associated stabilization value, lies in a predefined trigger region; and
    said evaluation device configured to use the zero system current flowing through the star point to form the stabilization values.

6. The electrical differential protection device according to claim 5, wherein said evaluation device is configured to determine a respective stabilization value by determining a maximum value from current measurements formed at the respective measuring points and zero system currents flowing on respective sides of the transformer.

7. The electrical differential protection device according to claim 5, which further comprises:
    a terminal of the differential protection device for a direct or indirect connection to a current measuring point of the star point;
    said evaluation device configured to determine the zero system current by measurement of a current flowing through the star point.

8. The electrical differential protection device according to claim 5, wherein said evaluation device is configured to determine the zero system current computationally from the current measurements acquired for individual phases.

* * * * *